United States Patent [19]

Jones

[11] 4,311,965
[45] Jan. 19, 1982

[54] MODULAR AMPLIFIER WITH DISCRETE POWER REDUCTION SWITCHING

[75] Inventor: William E. Jones, Kings Park, N.Y.

[73] Assignee: Hazeltine Corporation, Greenlawn, N.Y.

[21] Appl. No.: 140,062

[22] Filed: Apr. 14, 1980

[51] Int. Cl.³ .............................................. H03F 3/68
[52] U.S. Cl. .................................. 330/124 R; 330/51; 330/295
[58] Field of Search ............... 330/51, 53, 124 R, 286, 330/287, 295

[56] References Cited
U.S. PATENT DOCUMENTS 4,064,464 12/1977 Morse ..................................... 330/53

Primary Examiner—James B. Mullins
Assistant Examiner—Gene Wan
Attorney, Agent, or Firm—E. A. Onders; F. R. Agovino

[57] ABSTRACT

A modular amplifier comprising a plurality of modules receives a signal to be amplified and provides an amplified signal through power divider and power combiner circuits which are mirror images of each other. In particular, 2-way Wilkinson hybrid circuits are combined to deliver the input signal by providing a divided signal to each of the amplifier modules. The output of each of the modules is combined by 2-way Wilkinson hybrid circuits to provide the amplified signal output. In order to provide discrete power reduction switching from a full power condition to a reduced power condition, at least one of the inputs to a module is connected to a quarter-wave stub which is selectively grounded and open-circuited to reflect respectively an open circuit and a short circuit condition. In this way, each amplifier module performs similarly in the reduced power output condition as well as in the full power output condition.

6 Claims, 3 Drawing Figures

MODULAR AMPLIFIER WITH DISCRETE POWER REDUCTION SWITCHING

The Government has rights in this invention pursuant to Contract No. 00123-76-C-1121 awarded by the Department of the Navy.

BACKGROUND OF THE INVENTION

1. Field of the Invention

The invention generally relates to a simplified power switching technique for a multi-module amplifier wherein the performance of one or more of the modules may be discontinued without affecting the performance of the other modules.

2. Description of Prior Art

It is known that a three decibel power reduction switching circuit adds significant flexibility to a modular amplifier. Many techniques are known in the prior art to temporarily short circuit or disconnect a module of the modular amplifier in an attempt to achieve power reduction switching. However, the prior art systems for short circuiting or disconnection generally affect the input of the amplifier modules which are not short circuited or disconnected or affect the output of these operating modules.

SUMMARY OF THE INVENTION

It is an object of this invention to provide a power reduction switching system in which a modular amplifier can be changed from full power output to a power output that is less than the full power output.

It is another object of this invention to provide a modular amplifier with power reduction switching for a particular module of the amplifier, such switching not significantly affecting the input or output of other modules in the amplifier.

The modular amplifier with power reduction switching according to the invention includes a modular amplifier means comprising a plurality of amplifier modules. Each amplifier module has an input and an output. A power divider means having a power input receives a signal to be amplified. The power divider means has a plurality of outputs, each output connected to a corresponding module input. A power combiner means having a power output provides the amplified signal and has a plurality of inputs each connected to a corresponding amplifier module output. A power reflection means is connected to at least one of the power divider outputs for selectively reflecting a short circuit. In a preferred embodiment, the power dissipation means is comprised of a quarter-wave stub connected to the power divider output and a means for selectively grounding and open circuiting the quarter-wave stub.

For a better understanding of the present invention, together with other and further objects, reference is made to the following description, taken in conjunction with the accompanying drawings, and its scope will be pointed out in the appended claims.

DETAILED DESCRIPTION OF THE INVENTION

Many solid state transmitter and power supply specifications require the capability of being easily changed from full power output to a power output which is $3\pm 1$ db less than full power output. For example, the AN/APX-76B Airborne IFF Interrogator system presently being developed by Hazeltine Corporation requires a solid state transmitter/power supply with a discrete power reduction switching of $3\pm 1$ db. Such a power reduction system is also applicable to airborne interrogation systems which are affected by high traffic areas or which may require range limitations.

Figure 1:
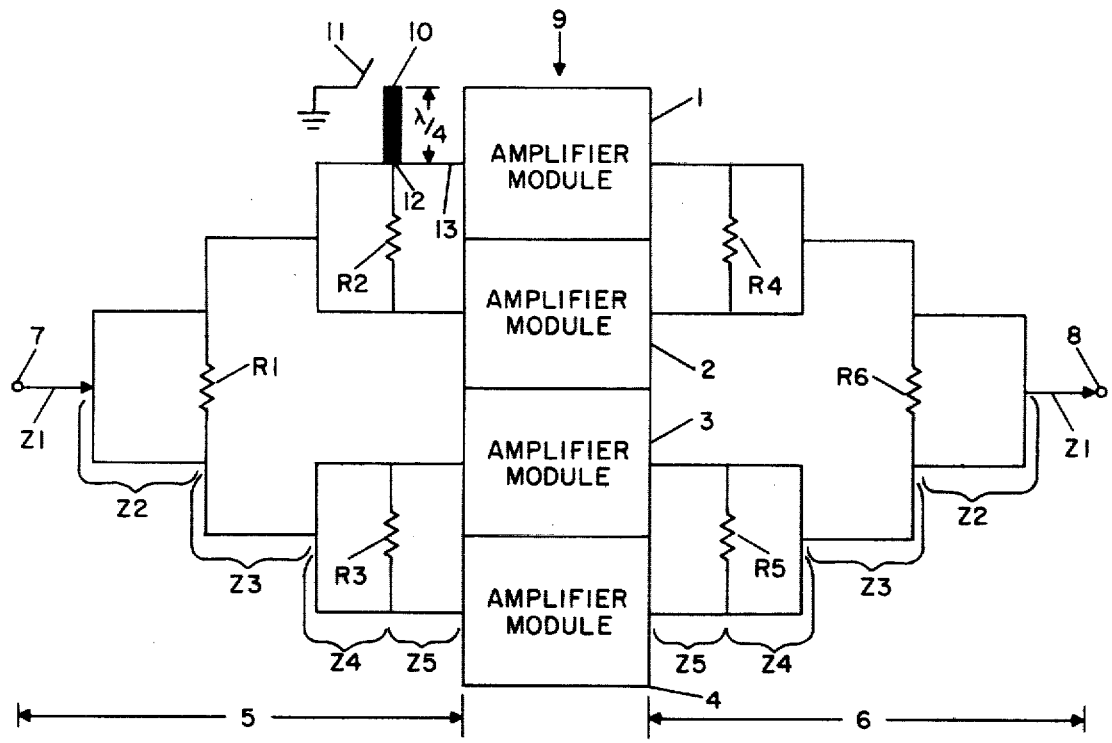
FIG. 1 is a schematic block diagram illustrating a four module amplifier with discrete power switching according to the invention.

The invention, as particularly illustrated in FIG. 1, provides for a simplified power switching technique enabling discrete power reduction switching of $3\pm 1$ db. Modular power amplifier 9 is comprised of four amplifier modules 1, 2, 3, 4, although any multi-module amplifier may be employed. It is contemplated that each amplifier module is a solid state unit functioning independently of the other modules. For example, each module may be a 500 watt unit. A signal to be amplified is provided via power divider 5 through power input 7. The power divider 5 is comprised of a plurality of 2-way Wilkinson hybrid circuits. In this case, three hybrid circuits are necessary to divide the incoming signal into four signals which can be applied to the four amplifier modules. Initially, a signal to be amplified is provided through power input 7 to a first 2-way Wilkinson hybrid circuit including resistor R1. Therein the signal is divided and each divided portion is provided to second and third 2-way Wilkinson hybrid circuits including resistors R2 and R3, respectively. The second and third hybrid circuits further divide the signal to provide a one-fourth of the input power to each amplifier module input.

The power combiner circuit 6 is a mirror image of the power divider circuit 5 and is similarly comprised of three 2-way Wilkinson hybrid circuits for combining the outputs of the amplifier modules. Fourth and fifth Wilkinson hybrid circuits including resistors R4 and R5, respectively, receive the module outputs, combine them and apply them to a sixth hybrid circuit including resistor R6. The output from the sixth hybrid circuit forms the power output 8 providing the amplified signal.

The three decibel power switching according to the invention consists of providing a power dissipation means attached to one of the hybrid circuits forming a part of the power divider 5. As illustrated in FIG. 1, it is contemplated that a quarter-wave stub 10 be connected to the resistor-input junction point 12 of resistor R2 and the input 13 of amplifier module 1. Reference character 11 represents a switch having no mechanical or electrical length which selectively grounds or open circuits the quarter-wave stub 10. When in the full power condition, the quarter-wave stub 10 reflects an open circuit at junction point 12 and does not affect the operation of the system. When the reduced power condition is desired, switch 11 is open as illustrated in FIG. 1 so that the quarter-wave stub 10 is ungrounded and reflects a short circuit at the junction point 12 between resistor R2 and the input 13 of amplifier module 1. In this short circuit condition, no signal is delivered to the input 13 of amplifier module 1. Because of the nature of the Wilkinson hybrid circuit, the power input into the other three 500 watt modules remains essentially unchanged.

For example, consider a situation where each of the amplifier modules 1, 2, 3, 4 is a solid state 500 watt module for amplifying a 1030 MHz signal. If the modular amplifier forms part of a system requiring a 50 ohm input and output, resistors R1, R2, R3, R4, R5, R6 are each 100 ohms and the power divider 5 and power combiner 6 are stripline circuits with lines Z1, Z3 and Z5 having a 50 ohm impedance and lines Z2 and Z4 having a 70 ohm impedance. In such an example, when switch 11 is open and the system is in the reduced power condition, the power that would normally go into the amplifier module 1 is now split. Fifty percent of the power which is normally dissipated into module 1 is now dissipated in resistor R2 and 25% of the power is dissipated in resistor R1 due to the arrangement of the hybrid circuits. The other 25% of the power which would normally be provided to module 1 is reflected back to the input. This is equivalent to an input voltage standing wave ratio of 1.67:1.

With no power being delivered to the module 1 in the reduced power mode, the output of module 1 is zero. The 1,500 watts from the other three 500 watt modules is now distributed within the power combiner 6 due to the nature of the Wilkinson hybrid circuits. Of the 1,500 watts provided at the outputs of modules 2, 3, 4, 250 watts is dissipated in resistor R4 and 125 watts is dissipated in resistor R6. This results in 1125 watts being delivered at power output 8.

In the full power mode the normal power output delivered at power output 8 is 2,000 watts. Under the proposed reduced power condition, as shown above, the power delivered at power output 8 is 1125 watts. Therefore, opening of the quarter-wave stub 10 results in a 2.5 db reduction in the power output of the modular amplifier 9. This is within the reduction range of $3 \pm 1$ db which is an object of this invention.

Figure 2:
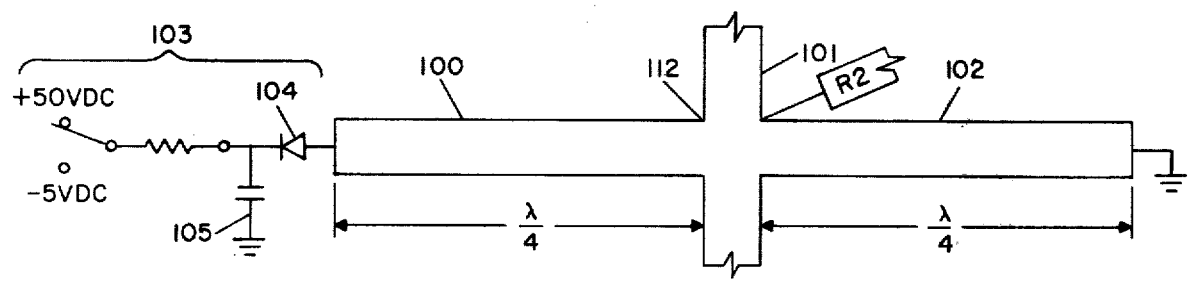
FIG. 2 illustrates a PIN diode switch embodiment according to the invention.

FIG. 2 illustrates an electronic switching technique for application as part of the invention. This embodiment of the invention is particularly applicable to printed stripline circuitry. Reference character 101 leads to the input of amplifier module 1. Quarter-wave stub 100 and quarter-wave stub 102 are connected to input 101 at the intersection point with resistor R2. Reference character 103 refers to the electronic switch used for selectively opening the quarter-wave stub 100. In particular, a forward biased diode 104 is capacitively coupled to ground 105. Forward bias of diode 104 is maintained by connection to a negative 5 volt DC source and grounded quarter-wave stub 102 provides a path for the forward biasing current. In the forward biased condition, quarter-wave stub 100 appears to be an open circuit at junction point 112 allowing full power to pass through to path 101. In the reduced output mode, diode 104 is reverse biased by the positive 50 volt DC source providing an open circuit condition for quarter-wave stub 100 and preventing the passage of a signal through path 101.

Figure 3:
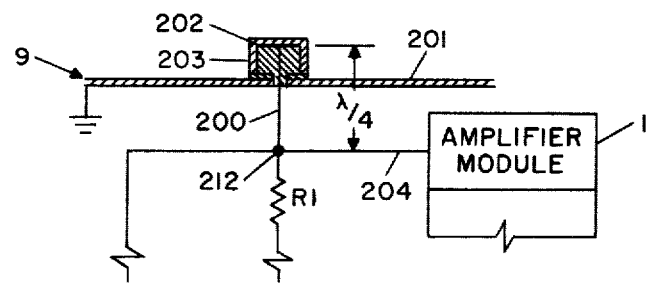
FIG. 3 illustrates a mechanical switching embodiment according to the invention.

FIG. 3 is a schematic illustration of a mechanical embodiment of the invention. In this mechanical embodiment, the quarter-wave stub 200 is extended through the casing 201 of the modular amplifier 9. The end of the stub 200 terminates in a coaxial grounding cap 203 with end insulator 202. In full power mode, the insulator 202 is removed and the short-circuited quarter-wave stub 200 reflects an open circuit at junction point 212 and amplifier module 1 receives the signal through line 204. In order to achieve the reduced power mode end insulator 202 is employed to insulate coaxial grounding cap 203 from the center conductor 200 so that stub 200 reflects a short circuit at junction point 212 preventing amplifier module 1 from receiving an input signal.

It is contemplated that each module input may be provided with a power reflection means such as a quarter-wave stub so that further discrete power reduction is possible. For example, effectively short-circuiting two module inputs of a four module amplifier will provide a 6.0 db reduction in power output. Short-circuiting three module inputs of a four module amplifier will provide a 12.0 db reduction in power output. It is further contemplated that the discrete reduction switching may be employed in any system using power divider and power combiner circuits.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed:
1. An amplifier system comprising:
   (a) amplifier means including a plurality of modules each having an input and an output;
   (b) power divider means having a power input for receiving a signal to be amplified and a plurality of outputs each connected to a corresponding module input;
   (c) power combiner means having a power output for providing the amplified signal and having a plurality of inputs each connected to a corresponding module output; and
   (d) power reflection means connected to at least one predetermined power divider output for selectively reflecting a short circuit.

2. The amplifier system of claim 1 wherein said power reflection means comprises a quarter-wave stub connected to the predetermined power divider output and means for selectively grounding the stub.

3. The amplifier system of claim 2 wherein said means for selectively grounding comprises a coaxial cap.

4. The amplifier system of claim 2 wherein said means for selectively grounding comprises a PIN diode switch.

5. The amplifier system of claims 1, 2, 3 or 4 wherein said power divider means is a mirror image of said power combiner means and each comprises a plurality of 2-way Wilkinson hybrid circuits.

6. The amplifier system of claim 5 wherein said power reflection means is connected to a resistor-input junction point of one of the 2-way Wilkinson hybrid circuits.

* * * * *